(12) United States Patent
Mitchell

(10) Patent No.: US 6,370,291 B1
(45) Date of Patent: Apr. 9, 2002

(54) PRINTED CIRCUIT BOARD WAVEGUIDE

(75) Inventor: James Cameron Mitchell, Tucson, AZ (US)

(73) Assignee: Opto Power Corporation, Tucson, AZ (US)

( * ) Notice: Subject to any disclaimer, the term of this patent is extended or adjusted under 35 U.S.C. 154(b) by 0 days.

(21) Appl. No.: 09/267,944

(22) Filed: Mar. 11, 1999

(51) Int. Cl.$^7$ ................................................ G02B 6/12
(52) U.S. Cl. .............................. 385/14; 385/47; 385/88; 385/123
(58) Field of Search ............................ 385/14, 15, 123, 385/47, 88, 130; 428/690; 273/348; 430/158; 528/353

(56) References Cited

U.S. PATENT DOCUMENTS 6,088,492 A * 7/2000 Kaneko et al. ............... 385/14

\* cited by examiner

*Primary Examiner*—Phan T. H. Palmer
(74) *Attorney, Agent, or Firm*—Herbert M. Shapiro

(57) ABSTRACT

A printed circuit board is made of a light transmitting material and is used as a waveguide for light. The board may be coated on both surfaces with a light-reflecting material to improve waveguiding properties. Such a board is operative to replace the microlens and optical fiber common in laser diode packages to form an optical path to deliver optical energy to some sensor position. A sensor of optical energy need only be coupled to a window in one of the coatings or positioned at the edge of the board.

10 Claims, 4 Drawing Sheets

PRINTED CIRCUIT BOARD WAVEGUIDE

FIELD OF THE INVENTION

This invention relates to a printed circuit board and more particularly to such a board comprising a material through which optical energy can be transmitted.

BACKGROUND OF THE INVENTION

Printed circuit boards are commonly used as a support for a variety of electrical components as is well known. It is also well known that laser diodes are amongst the components secured to a printed circuit board.

Laser diodes are constructed from a plurality of suitable layers on a substrate. The layers form a quantum well which defines an emitting facet for light energy. The quantum well is sandwiched between waveguiding layers which, in turn, are sandwiched between cladding layers as is well understood.

Printed circuit boards which include lasers also typically require sensors which are responsive to laser emissions. Such sensors have to be placed in an optical path of the laser output. Consequently, constraints are placed on the position of the sensors and applications for photosensitive circuits, thus, are limited.

BRIEF DESCRIPTION OF THE INVENTION

In accordance with the principles of this invention, the circuit board itself is constructed of a material which transmits light energy and thus functions as a waveguide. Further, reflective coatings are added to the opposite faces of the circuit board to enhance the waveguide properties. Light directed at the edge of the circuit board may be sensed by a sensor located anywhere on the face of the board at a window opened in the coating there. Constraints on the placement of sensors are relaxed.

DETAILED DESCRIPTION OF ILLUSTRATIVE EMBODIMENTS OF THIS INVENTION

Figure 1:
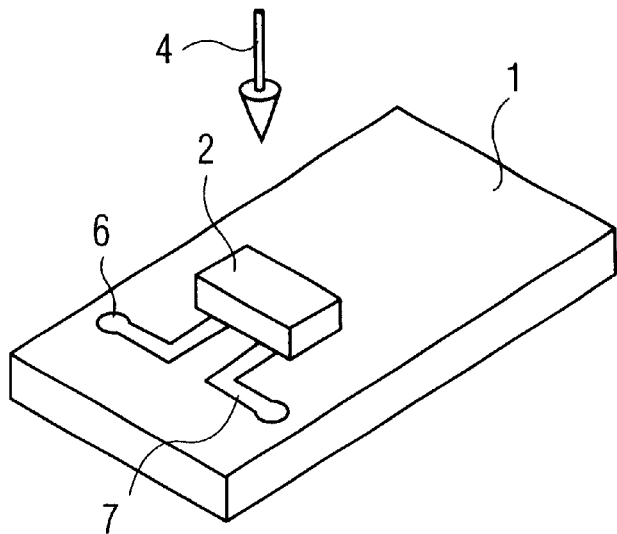
FIGS. 1, 2 and 3 are schematic illustrations of prior art circuit boards with sensors attached thereto.

FIG. 1 shows a photosensitive circuit attached to a prior art circuit board made of opaque material. The circuit board is designated 1 and the photo sensitive circuit is designated 2. The circuit is responsive to light, designated 4, represented by the downward directed arrow in the figure. The sensor is connected to utilization circuitry (not shown) via conductor traces represented by lines 6 and 7.

Figure 2:
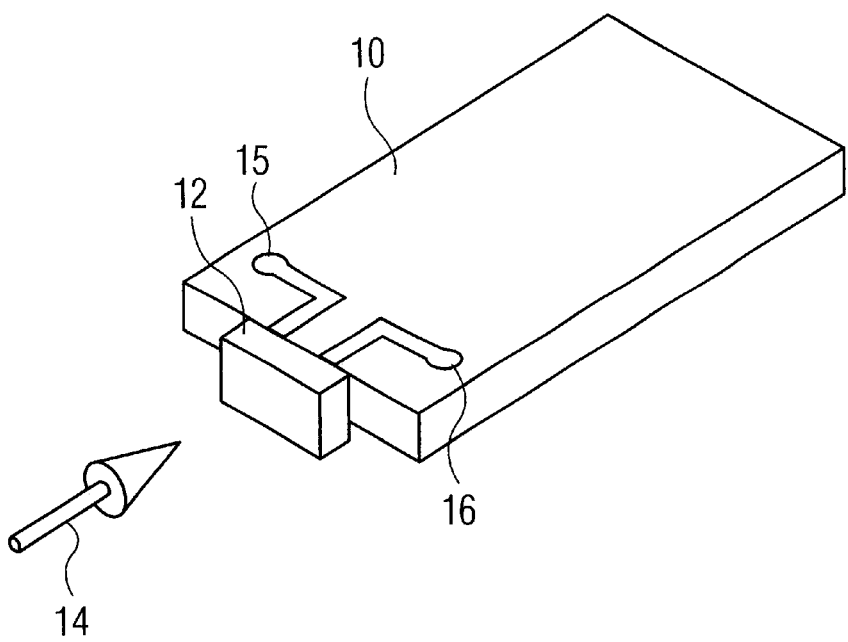

FIG. 2 shows an alternative prior art arrangement where the sensor is placed at the edge of a circuit board. Specifically, FIG. 2 shows a circuit board 10 with a photosensor 12 coupled to the edge of the board as shown and responsive to light represented by arrow 14. The sensor is connected to utilization circuits (not shown) via conductor traces 15 and 16.

Figure 3:
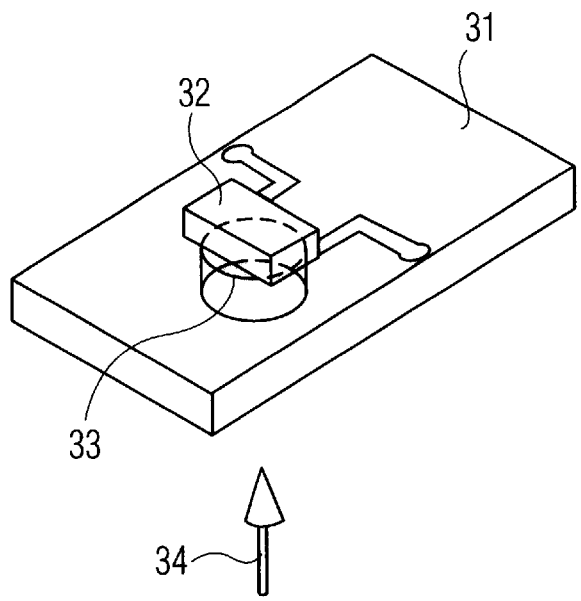

FIG. 3 shows an alternative prior art construction using an opaque circuit board 31 with a photosensor 32 attached to the surface of the board over a hole 33 in the board. The sensor is responsive to light directed upwards, as viewed, through hole 33 at the sensor. The light is represented by arrow 34 and the sensor, in this case, is mounted face down.

Figure 4A:
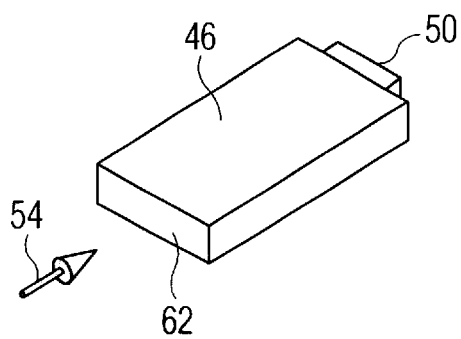
FIGS. 4A, 5A, and 6A are schematic illustrations of alternative circuit boards in accordance with the principles of this invention.

FIG. 4A shows a printed circuit board 46 of a transparent material, illustratively Kapton, in accordance with the principles of this invention. A photosensor 50 is coupled to the edge of the circuit board. Light directed into the opposite edge of the board, as represented by arrow 54, is guided to the sensor by the board itself.

Figure 4B:
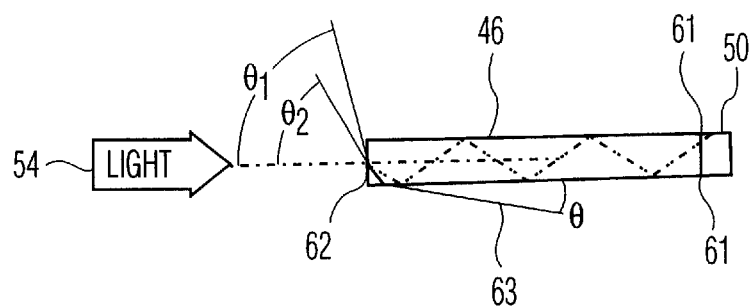
FIGS. 4B, 5B, and 6B are schematic illustrations of side views of the circuit boards of FIGS. 4A, 5A, and 6A respectively.

FIG. 4B shows a schematic side view of board 46 with sensor 50 secured by top and bottom ribbons 61 of solder or epoxy cement. Light entering edge 62 of the board is transmitted by the board if the light is incident at an angle $Ø_2$ less than the critical angle of reflection characteristic of the board. Light incident at an angel $Ø_1$ greater than that critical angle, exits the board as indicated by arrow 63.

Figure 5A:
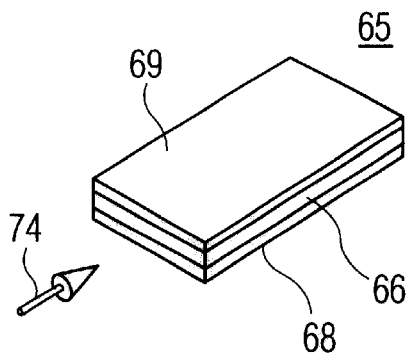

FIG. 5A shows a printed circuit board with reflective coatings on its surfaces. The board is designated 65 in FIG. 5A and has a transparent, illustratively rigid center layer 66 with reflective coatings 68 and 69 sandwiching layer 66. Light directed from the left, as viewed, at the edge of the board is transmitted to the opposite edge. Layer 66 corresponds to a prior art circuit board in structure but comprises a transparent material according to the principles of this invention.

Figure 5B:
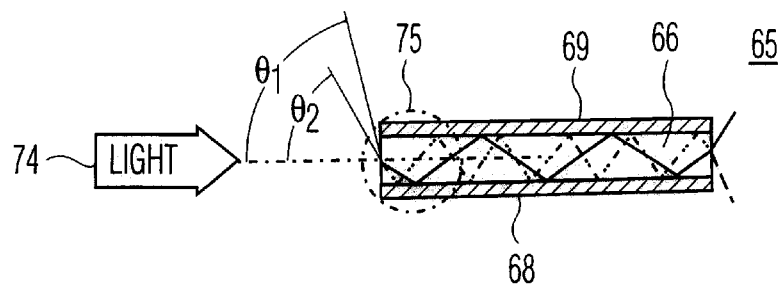
Figure 5C:
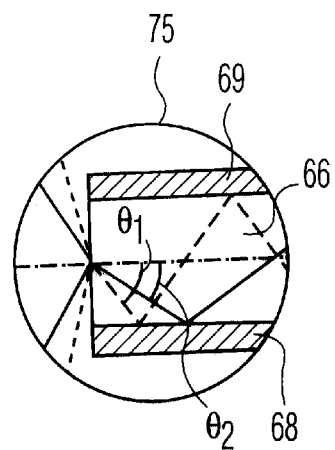
FIGS. 5C and 6C are enlarged views of portions of the side views of FIGS. 5B and 6B respectively.

FIG. 5B is a schematic side view of the embodiment of FIG. 5A. Light, represented by arrow 74, incident at an angle $Ø_2$ and greater angle $Ø_1$, exits at the right edge of the board to impinge upon a sensor (not shown) coupled to that (exit) edge. FIG. 5C shows enlarged the portion of FIG. 5B encompassed by circle 75. FIG. 5C indicates the angles $Ø_1$ and $Ø_2$ within layer 66.

Figure 6A:
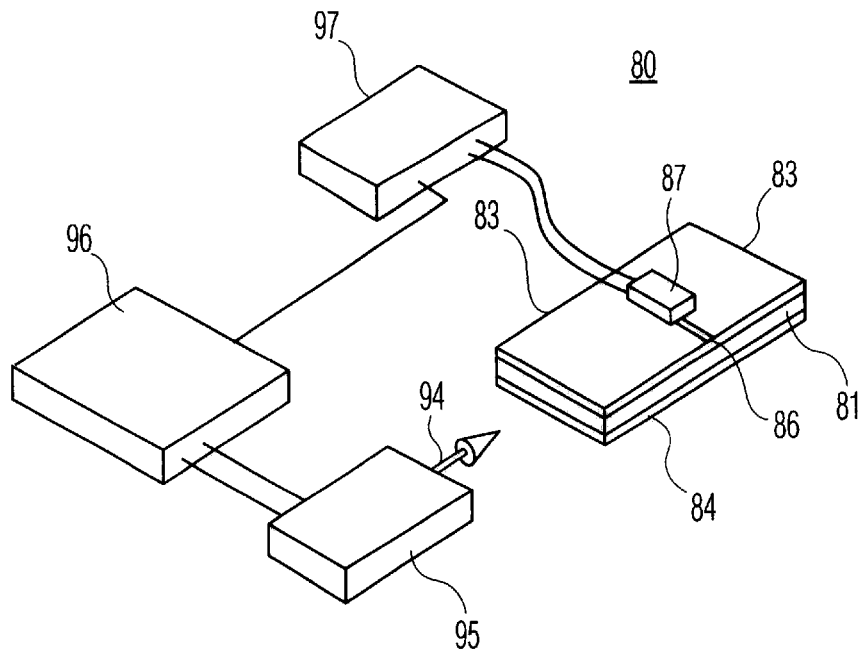
Figure 6B:
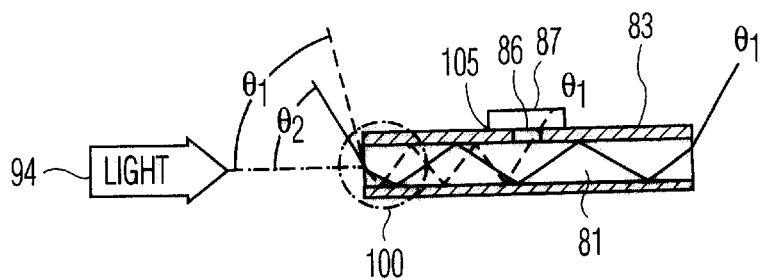
Figure 6C:
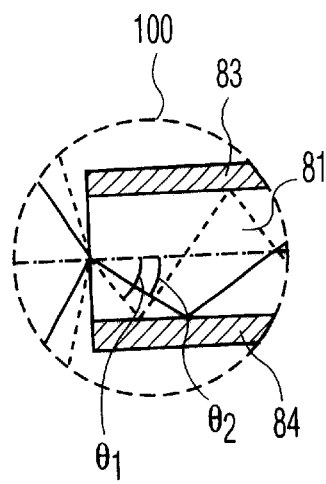

FIGS. 6A, 6B, and 6C illustrate an embodiment analogous to that shown in FIGS. 5A, 5B, and 5C with a sensor positioned at a window in one of the reflective coatings rather than at the edge of the circuit board. Specifically, FIG. 6A shows a circuit board 80 with a transparent layer 81 and first and second reflective coatings 83 and 84. Coating 83 has a window 86 opened in it. Photosensor 87 is positioned, face down, at the window and is responsive to light directed at an edge of the board as indicated by arrow 94. The light is shown emitted from a laser diode 95 under the control of controller 96. Photosensor 87 is connected to a utilization circuit 97.

FIG. 6B shows the ray traces for light within layer 81, reflecting back and forth between reflective coatings. Light incident at angle $Ø_1$ exits through hole 86. Light incident at angle $Ø_2$ exits at the right edge of the board as shown. FIG. 6C shows enlarged the portion of the board encompassed by circle 100 in FIG. 6B illustrating the angles $Ø_1$ and $Ø_2$ as well as the ray traces therein.

The sensor is secured by solder or epoxy cement as indicated at 105.

The circuit board in accordance with the present invention may be rigid or flexible and may be made of Kapton or any other transparent, electrically insulating material such as polyimide, polyester, acrylic and propylene. In one reduction to practice, a board had a thickness of about 0.020 inch with antireflective coatings of copper, gold, magnesium fluoride, silver or aluminum 0.000050 inch thick. But the thicknesses may vary as do those of prior art boards.

What is claimed is:

1. Apparatus including a printed circuit board, said board comprising a planar member of a material having waveguiding properties, said member having first and second parallel surfaces, said board having a reflective coating on each of said first and second surfaces.

2. Apparatus as in claim 1 wherein said board has a light source coupled thereto for directing light into the edge of said board.

3. Apparatus as in claim 2 wherein said board also includes a window in one of said coating for allowing light to escape from said board.

4. Apparatus as in claim 3 wherein said board includes a light sensor coupled to said board at said window.

5. Apparatus as in claim 2 wherein said light source is a laser diode.

6. Apparatus as in claim 5 wherein the light from said laser diode is directed at the edge of said board in a manner and at an angle to be reflected back and forth between said reflective coatings.

7. Apparatus including a printed circuit board comprising a transparent material, said board having first and second major surfaces and an edge, said apparatus including a light source positioned to direct light at said edge, said apparatus including a sensor coupled to said first surface for sensing said light.

8. Apparatus as in claim 7 also including a reflective coating on each of said major surfaces.

9. Apparatus as in claim 8 wherein said coating on said first major surface includes a window.

10. Apparatus as in claim 9 also including a light sensor coupled to said board at said window and responsive to said light.

* * * * *